United States Patent
Sperling et al.

(10) Patent No.: US 11,204,635 B2
(45) Date of Patent: Dec. 21, 2021

(54) DROOP DETECTION USING POWER SUPPLY SENSITIVE DELAY

(71) Applicant: International Business Machines Corporation, Armonk, NY (US)

(72) Inventors: Michael Sperling, Poughkeepsie, NY (US); Pawel Owczarczyk, Highland, NY (US); Akil Khamisi Sutton, Dutchess County, NY (US); Erik English, Beacon, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 214 days.

(21) Appl. No.: 16/578,588

(22) Filed: Sep. 23, 2019

(65) Prior Publication Data
US 2021/0089104 A1    Mar. 25, 2021

(51) Int. Cl.
| | |
|---|---|
| *G06F 1/26* | (2006.01) |
| *G06F 1/32* | (2019.01) |
| *G06F 1/3203* | (2019.01) |
| *G06F 1/08* | (2006.01) |
| *G01R 31/30* | (2006.01) |
| *G06F 1/30* | (2006.01) |
| *G01R 19/25* | (2006.01) |

(52) U.S. Cl.
CPC ........... *G06F 1/3203* (2013.01); *G01R 19/25* (2013.01); *G01R 31/3004* (2013.01); *G06F 1/08* (2013.01); *G06F 1/305* (2013.01)

(58) Field of Classification Search
CPC .......... G06F 1/3203; G06F 1/08; G06F 1/305; G01R 31/3004; G01R 19/25; G01R 19/16552
See application file for complete search history.

(56) References Cited

U.S. PATENT DOCUMENTS

| | | |
|---|---|---|
| 4,128,816 A | 12/1978 | Shimotsuma |
| 4,308,496 A | 12/1981 | Nagano |
| 4,473,762 A | 9/1984 | Iwahashi et al. |
| 4,918,336 A | 4/1990 | Graham et al. |
| 5,081,380 A | 1/1992 | Chen |
| 5,197,033 A | 3/1993 | Watanabe et al. |
| 5,510,729 A | 4/1996 | Reymond |
| 5,610,547 A | 3/1997 | Koyama et al. |

(Continued)

FOREIGN PATENT DOCUMENTS

| | | |
|---|---|---|
| CN | 100428616 C | 10/2008 |
| CN | 1938932 B | 9/2010 |

(Continued)

OTHER PUBLICATIONS

Erik English et al., "Voltage Sensitive Current Circuit," U.S. Appl. No. 16/578,613, filed Sep. 23, 2019.

(Continued)

*Primary Examiner* — Xuxing Chen
(74) *Attorney, Agent, or Firm* — Cantor Colburn LLP; Margaret McNamara

(57) ABSTRACT

Aspects of the invention include a circuit having a power supply sensitive delay circuit, a variable delay circuit coupled to the power supply sensitive delay circuit, a delay line coupled to the variable delay circuit, and a logic circuit coupled to the delay line.

18 Claims, 16 Drawing Sheets

(56) References Cited

U.S. PATENT DOCUMENTS

| | | |
|---|---|---|
| 5,856,757 A | 1/1999 | Eschauzier |
| 5,939,933 A | 8/1999 | Wang |
| 6,057,727 A | 5/2000 | Dautriche et al. |
| 6,137,720 A | 10/2000 | Lancaster |
| 6,433,624 B1 | 8/2002 | Grossnickle |
| 6,476,656 B2 | 11/2002 | Dally et al. |
| 6,496,056 B1 | 12/2002 | Shoji |
| 6,661,253 B1 | 12/2003 | Lee et al. |
| 6,686,792 B2 | 2/2004 | Nakamiya et al. |
| 6,882,238 B2 | 4/2005 | Kurd et al. |
| 7,321,242 B2 | 1/2008 | Mandegaran et al. |
| 7,525,345 B2 | 4/2009 | Jang |
| 7,911,282 B2 | 3/2011 | Fujino |
| 8,339,190 B2 | 12/2012 | Otsuga et al. |
| 8,648,645 B2 | 2/2014 | Konstadinidis et al. |
| 8,841,890 B2 | 9/2014 | Ochoa et al. |
| 8,847,777 B2 | 9/2014 | Ramaswami |
| 9,148,057 B2 | 9/2015 | Kim |
| 9,229,465 B2 | 1/2016 | Dhiman et al. |
| 9,473,127 B1 | 10/2016 | Azin |
| 9,634,651 B1 | 4/2017 | Tseng |
| 10,270,630 B2 | 4/2019 | Yun et al. |
| 10,833,653 B1 | 11/2020 | Sperling et al. |
| 2001/0054925 A1 | 12/2001 | Dally et al. |
| 2002/0190283 A1* | 12/2002 | Seno ............... H03K 5/135 |
| | | 257/275 |
| 2003/0109142 A1 | 6/2003 | Cable et al. |
| 2003/0151920 A1 | 8/2003 | Shin |
| 2005/0094421 A1 | 5/2005 | Flore |
| 2005/0099210 A1* | 5/2005 | Fetzer ............... G06F 1/3203 |
| | | 327/101 |
| 2005/0099234 A1 | 5/2005 | Perner |
| 2006/0055444 A1 | 3/2006 | Ogasawara et al. |
| 2006/0076993 A1 | 4/2006 | Teo et al. |
| 2006/0125529 A1 | 6/2006 | Laulanet et al. |
| 2006/0170467 A1 | 8/2006 | Messager |
| 2006/0232316 A1* | 10/2006 | Nomura ............ H03K 5/133 |
| | | 327/291 |
| 2007/0013414 A1 | 1/2007 | Paillet et al. |
| 2007/0013454 A1 | 1/2007 | Ji |
| 2007/0079147 A1 | 4/2007 | Pyeon et al. |
| 2008/0007272 A1* | 1/2008 | Ferraiolo ......... G01R 31/31721 |
| | | 324/617 |
| 2008/0088365 A1 | 4/2008 | Jang et al. |
| 2008/0218199 A1 | 9/2008 | Matsushima |
| 2008/0246512 A1 | 10/2008 | Seth et al. |
| 2008/0266916 A1 | 10/2008 | Yen |
| 2009/0058466 A1 | 3/2009 | Parks et al. |
| 2009/0189702 A1* | 7/2009 | Berthold .......... G01R 19/16552 |
| | | 331/46 |
| 2010/0164538 A1 | 7/2010 | Greimel-Rechling |
| 2012/0169391 A1 | 7/2012 | Sofer et al. |
| 2013/0034139 A1 | 2/2013 | Khlat et al. |
| 2013/0169330 A1 | 7/2013 | Ma |
| 2013/0314020 A1 | 11/2013 | Sugie |
| 2013/0342256 A1 | 12/2013 | Wadhwa |
| 2014/0145707 A1 | 5/2014 | Tanabe et al. |
| 2014/0292420 A1 | 10/2014 | Green et al. |
| 2015/0042386 A1 | 2/2015 | Bhowmik et al. |
| 2016/0034014 A1 | 2/2016 | Turullols et al. |
| 2016/0105189 A1 | 4/2016 | Maeda |
| 2017/0060165 A1 | 3/2017 | Kim et al. |
| 2018/0302073 A1 | 10/2018 | Ko et al. |
| 2020/0028514 A1* | 1/2020 | Hanke ...................... G06F 1/28 |
| 2021/0064380 A1* | 3/2021 | Mai ........................ G06F 17/16 |

FOREIGN PATENT DOCUMENTS

| | | |
|---|---|---|
| CN | 205015388 U | 2/2016 |
| CN | 206331020 U | 7/2017 |
| KR | 101658783 B1 | 9/2016 |

OTHER PUBLICATIONS

Krishnaveni, S. & Bibin Sam Paul, S., "Desing of VCO Using Current Mode Logic With Low Supply Sensitivity," Feb. 2014, vol. 3, Issue 2, IJRET: International Journal of Reasearch in Engineering and Technology, pp. 528-530.

List of IBM Patents or Patent Applications Treated as Related; (Appendix P); Date Filed: Sep. 23, 2019, 2 pages.

Michael Sperling et al., "Voltage Sensitive Delay," U.S. Appl. No. 16/578,597, filed Sep. 23, 2019.

Michael Sperling et al., "Voltage Starved Passgate With IR Drop," U.S. Appl. No. 16/578,622, filed Sep. 23, 2019.

* cited by examiner

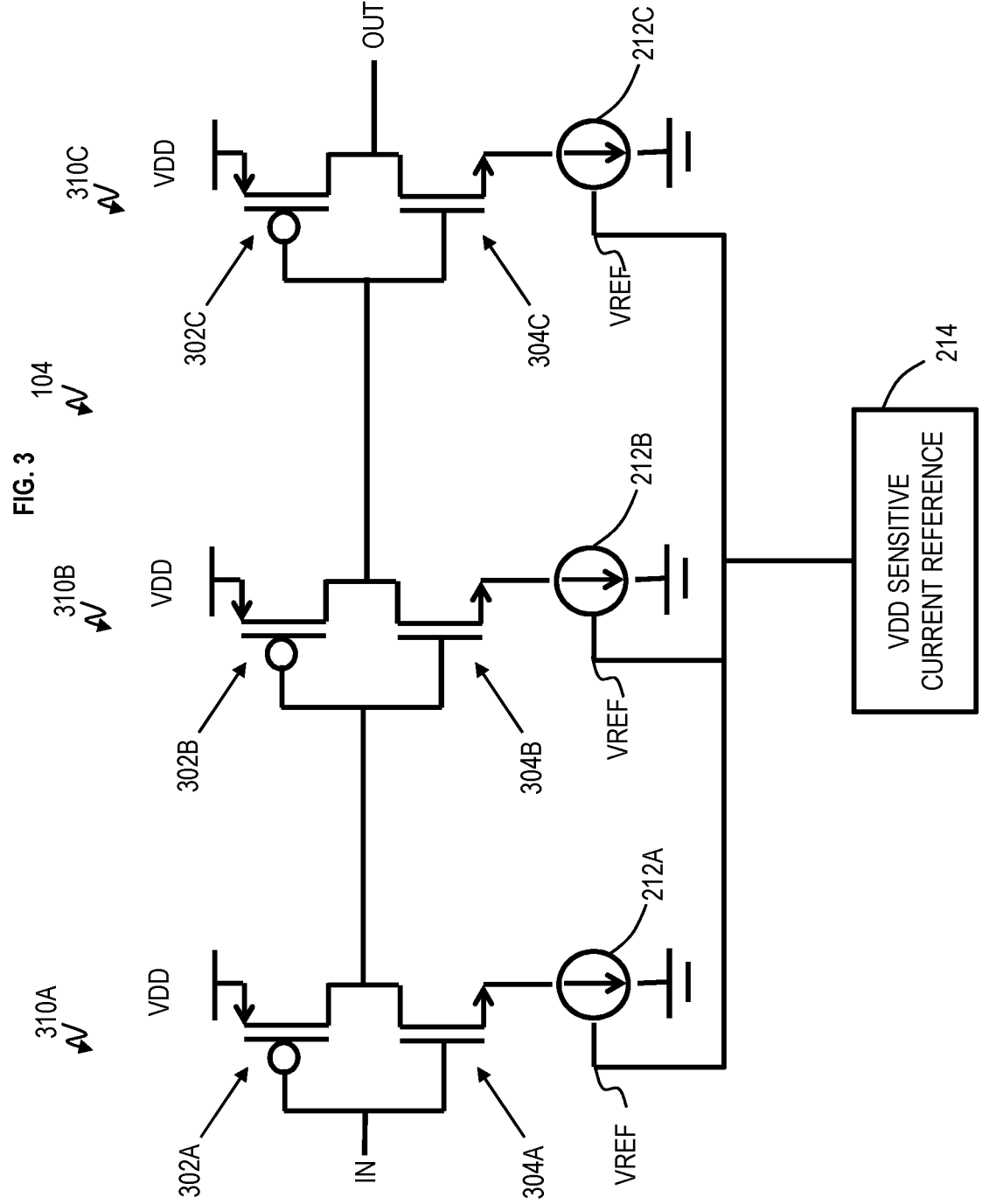

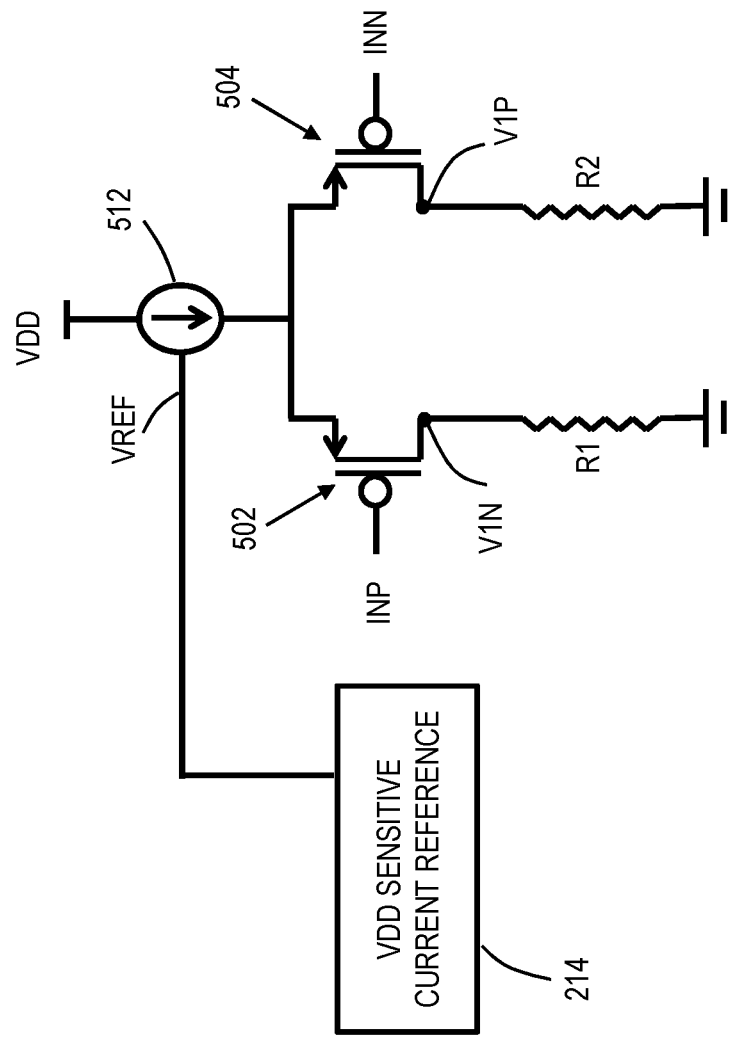

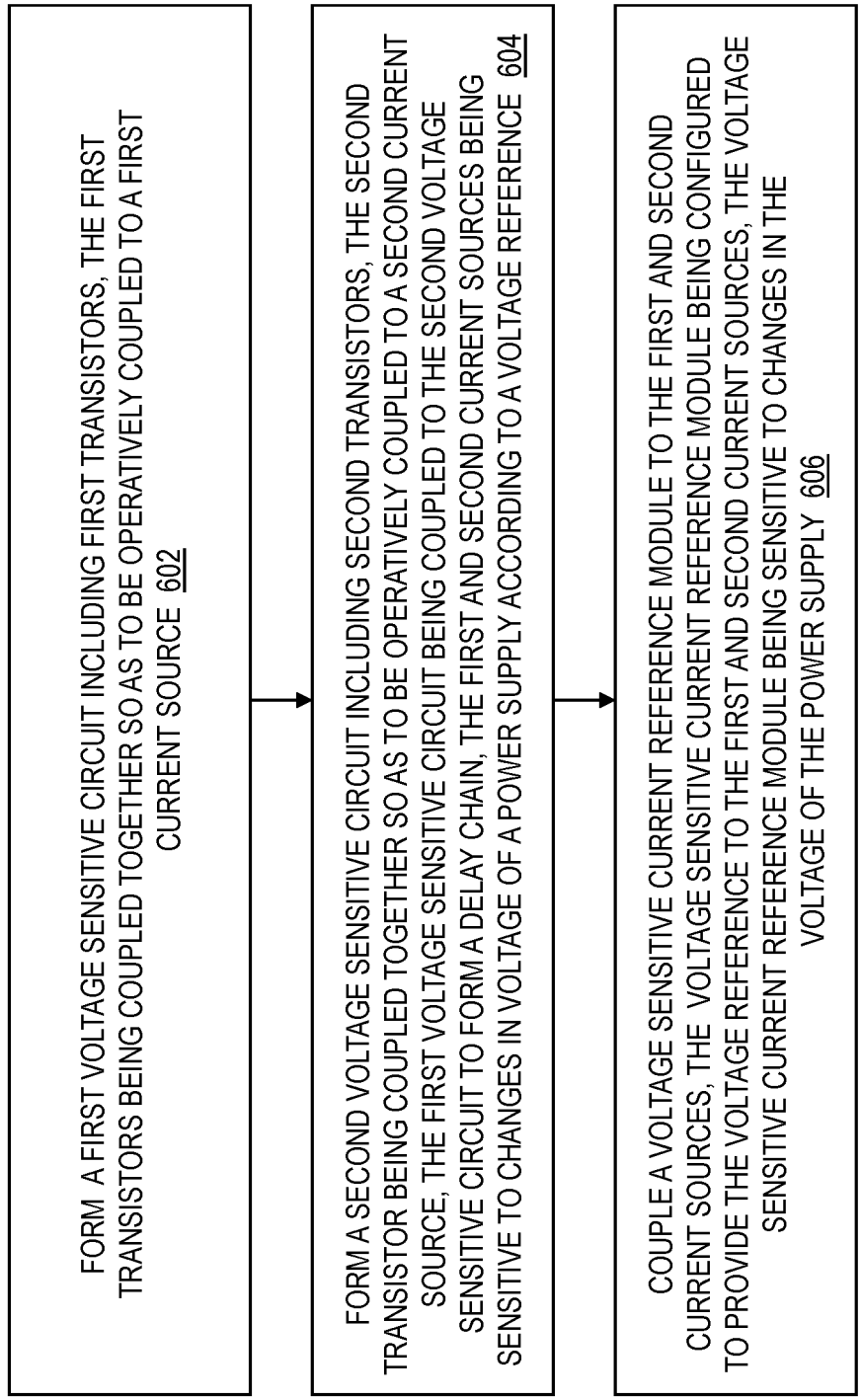

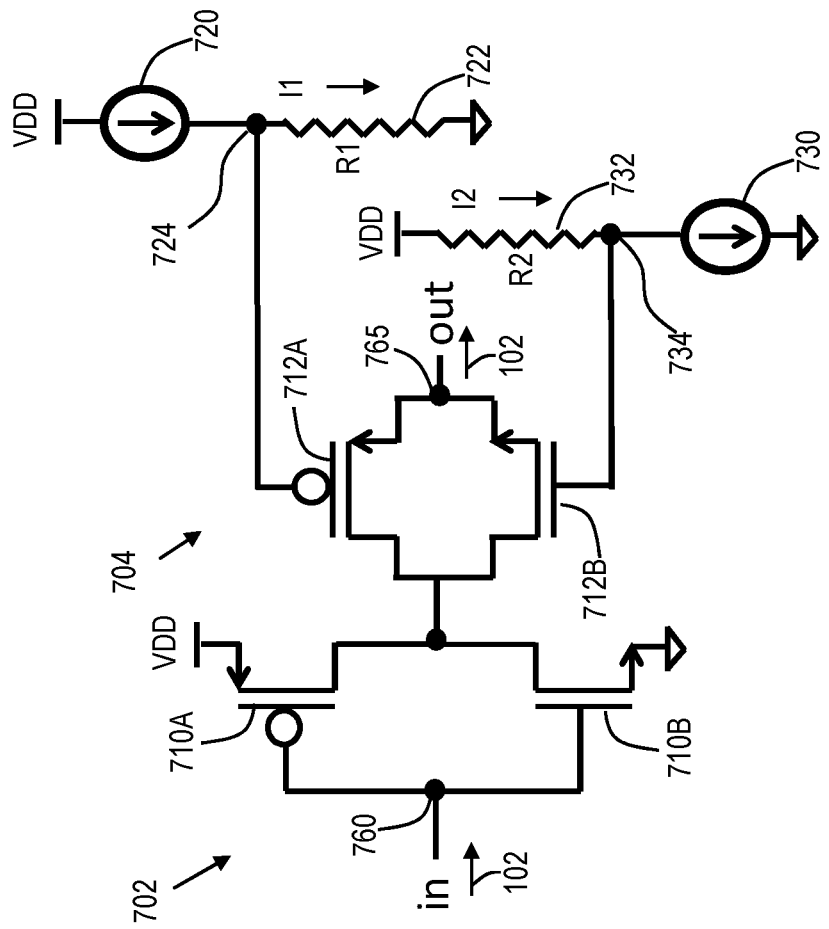

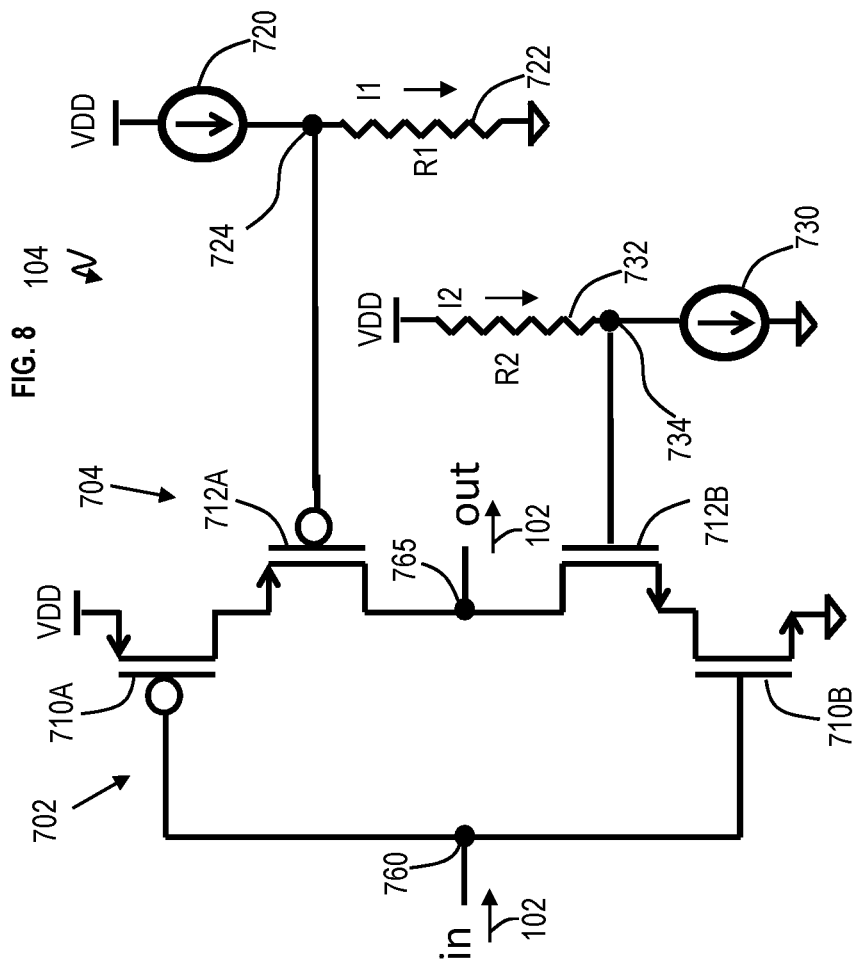

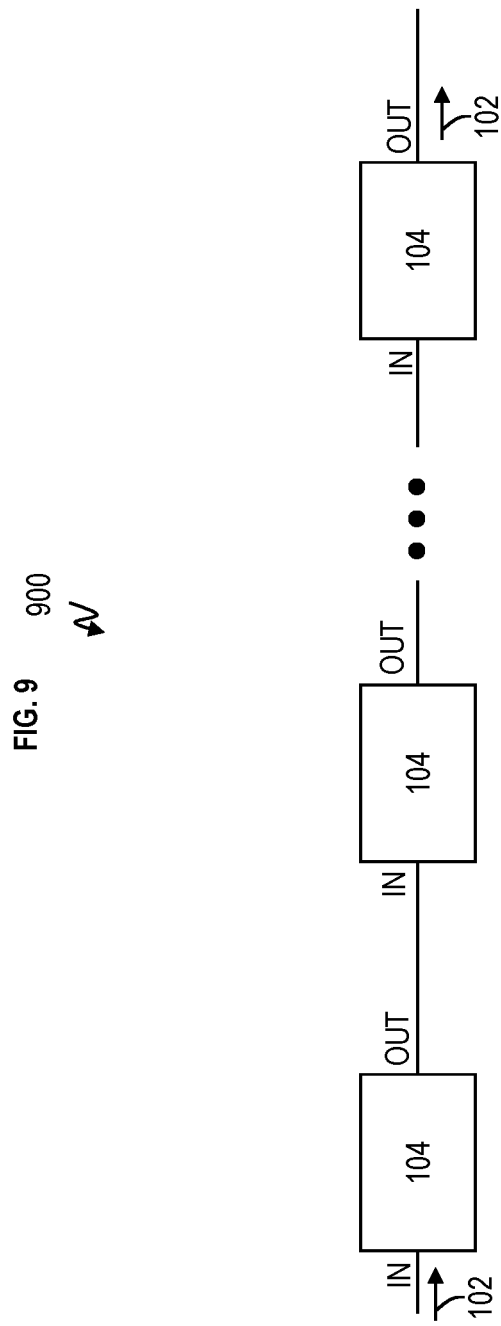

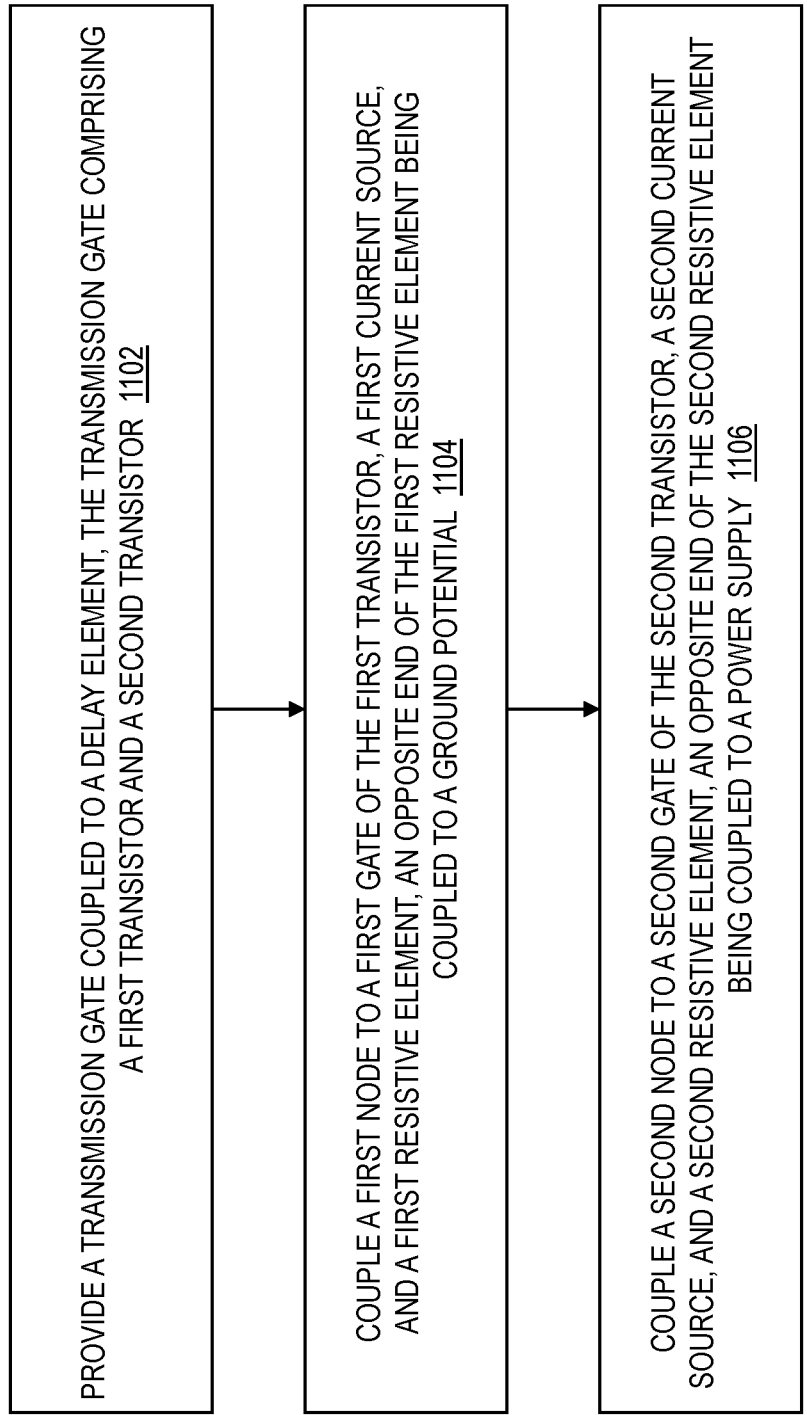

FIG. 13  1300

FORM A POWER CIRCUIT INCLUDING AN AMPLIFIER, A RESISTOR, A CURRENT SOURCE, AND A FIRST NODE, ONE END OF THE RESISTOR BEING COUPLED TO A FIRST VOLTAGE, THE FIRST NODE BEING COUPLED TO AN OPPOSITE END OF THE RESISTOR, A FIRST INPUT TERMINAL OF THE AMPLIFIER, AND THE CURRENT SOURCE, WHEREIN THE FIRST NODE HAS A SECOND VOLTAGE  1302

COUPLE A VOLTAGE SENSITIVE CIRCUIT INCLUDING A LOGIC GATE TO BOTH A SECOND INPUT TERMINAL OF THE AMPLIFIER AND AN OUTPUT TERMINAL AT A SECOND NODE, THE VOLTAGE SENSITIVE CIRCUIT BEING CONFIGURED TO PROVIDE AN OUTPUT BASED ON THE SECOND VOLTAGE, THE VOLTAGE SENSITIVE CIRCUIT BEING CONFIGURED TO MODULATE A DELAY IN THE OUTPUT BASED ON A DIFFERENCE BETWEEN THE FIRST VOLTAGE AND THE SECOND VOLTAGE  1304

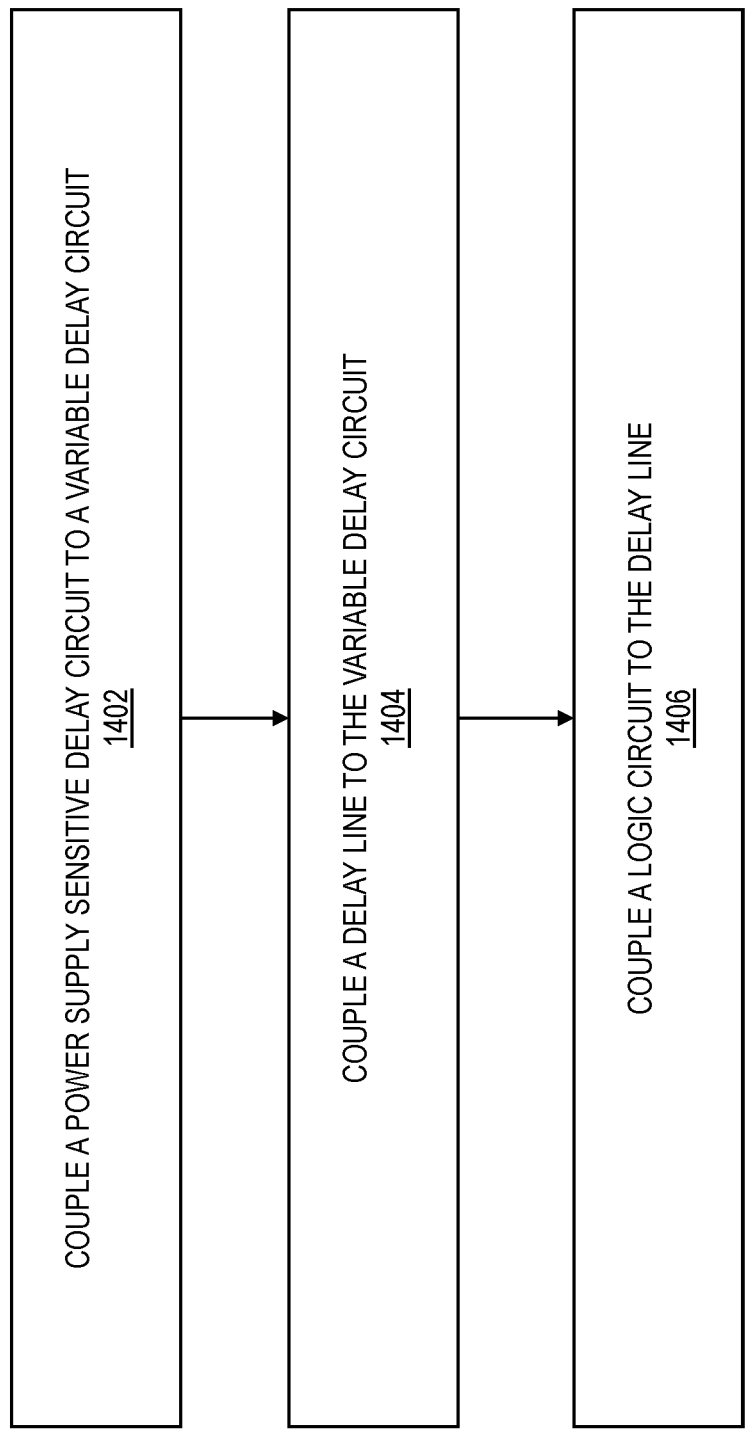

DROOP DETECTION USING POWER SUPPLY SENSITIVE DELAY

BACKGROUND

The present invention generally relates to integrated circuits, and more specifically, to droop detection using power supply sensitive delay.

In an electronic device, power is needed to run the device. Semiconductor devices, such as microprocessors, stand-alone and embedded memory devices, etc., receive power from a power supply. Microprocessors can execute instructions resulting in certain tasks being performed. In some cases, there can be a current spike or a change in current consumption because of the different instructions executed by the microprocessor, which causes voltage variation or spikes, known as droops on the power supply. This may occur because some instructions might require more power than others. A droop is defined as an output voltage change as a function of time and may include both under-voltage and over-voltage conditions. A voltage droop refers to a loss of supply voltage as a device tries to drive a load. Under certain operating conditions, a voltage droop may lead to an integrated circuit's power supply falling below proper operating levels.

SUMMARY

Embodiments of the present invention are directed to droop detection using power supply sensitive delay. A non-limiting example circuit includes a power supply sensitive delay circuit, a variable delay circuit coupled to the power supply sensitive delay circuit, a delay line coupled to the variable delay circuit, and a logic circuit coupled to the delay line.

A non-limiting example method of forming a circuit includes coupling a power supply sensitive delay circuit to a variable delay circuit, coupling a delay line to the variable delay circuit, and coupling a logic circuit to the delay line.

A non-limiting circuit includes a power supply sensitive delay circuit, a variable delay circuit coupled to the power supply sensitive delay circuit, a delay line coupled to the variable delay circuit, a logic circuit coupled to the delay line via latches, and a clock selector coupled to the latches.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 3 illustrates a block diagram of a voltage sensitive delay circuit composed of current starved inverters in accordance with one or more embodiments of the present invention;

FIG. 5 illustrates a block diagram of example circuit which can replace circuits in FIG. 2 in accordance with one or more embodiments of the present invention;

FIG. 6 illustrates a flow diagram of a method for configuring a circuit in accordance with one or more embodiments of the present invention;

FIG. 7 illustrates a block diagram of an example circuit in accordance with one or more embodiments of the present invention;

FIG. 8 illustrates a block diagram of an example circuit in accordance with one or more embodiments of the present invention;

FIG. 9 illustrates a block diagram of example circuits connected in a chain in accordance with one or more embodiments of the present invention;

FIG. 11 illustrates a flow diagram of a method for configuring a circuit in accordance with one or more embodiments of the present invention;

FIG. 13 illustrates a flow diagram of a method for configuring a circuit in accordance with one or more embodiments of the present invention; and FIG. 14 illustrates a flow diagram of a method for configuring a circuit which is a voltage droop detection circuit in accordance with one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide a delay circuit that makes delay more sensitive to changes in voltage (VDD) of a power supply. The delay circuit becomes faster (i.e., delay decreases) as the voltage increases, and the delay circuit becomes slower (i.e., delay increases) as the voltage decreases (i.e., voltage drops). One or more embodiments of the invention can be utilized as a voltage droop detection circuit.

Figure 1:
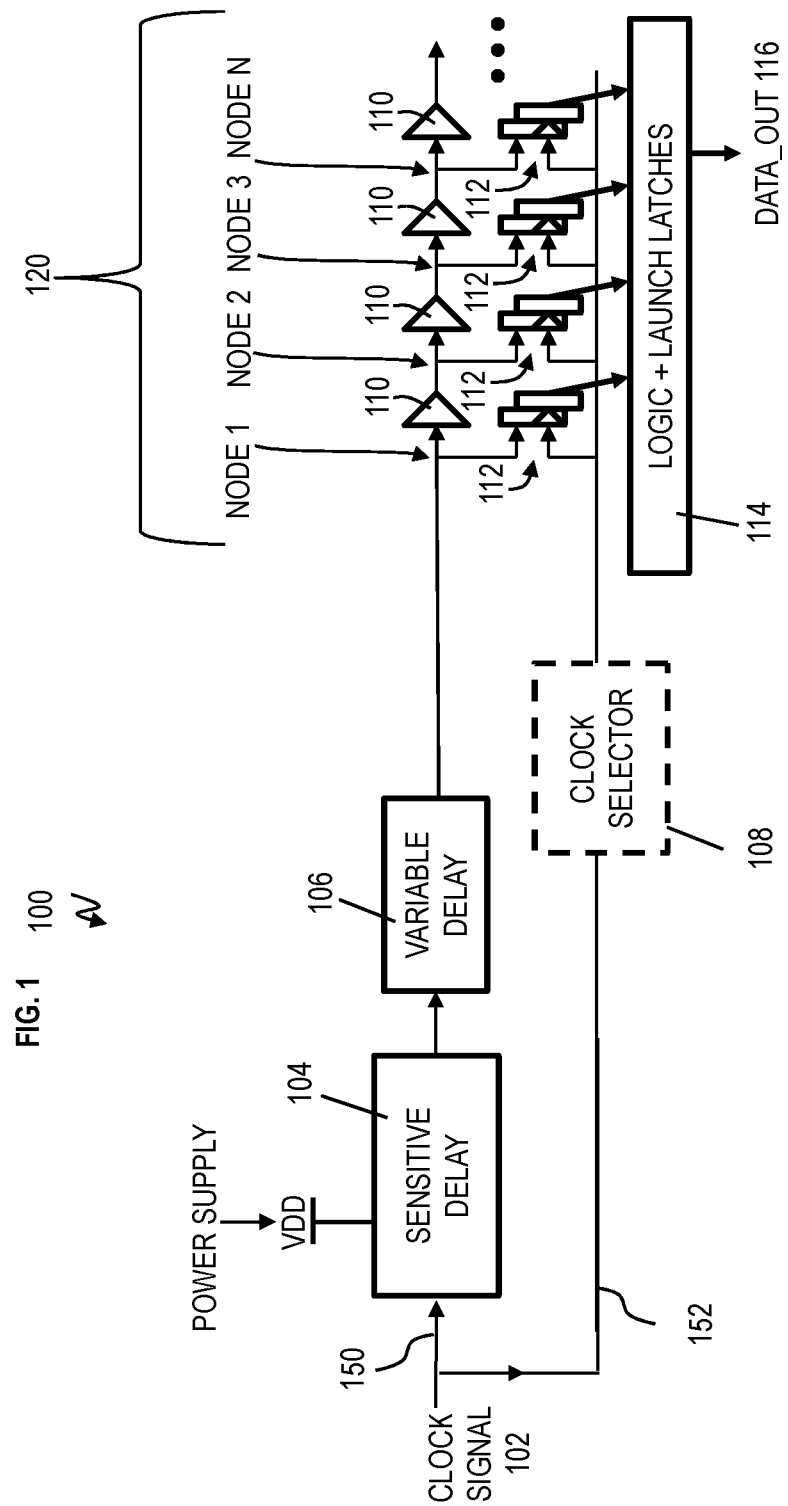
FIG. 1 illustrates a block diagram of voltage droop detection circuit for providing voltage sensitive delay in accordance with one or more embodiments of the present invention.

Turning now to FIG. 1, a circuit 100 for providing voltage sensitive delay is generally shown in accordance with one or more embodiments of the present invention. The circuit 100 is a voltage droop detection circuit which detects changes in a power supply (e.g., voltage VDD), supply voltage, etc., by causing an extra/greater delay in transmitting a (reference) clock signal because the voltage droop detection circuit includes additional voltage sensitivity to a voltage droop by the power supply being monitored.

The circuit 100 (i.e., voltage droop detection circuit) includes a power supply voltage sensitive delay circuit 104, and the power supply voltage sensitive delay circuit 104 is configured to receive, via electrical path 150, a (reference) clock signal 102 which is delayed in relation to a voltage droop by the power supply (e.g., voltage VDD) being monitored. The power supply voltage sensitive delay circuit 104 is coupled to a variable delay circuit 106 which is configured to compensate for delay by centering the delay of the clock signal 102 for capture in accordance with an optional clock selector 108. The output from the variable delay circuit 106 is passed to a delay line 120 of buffers 110. In FIG. 1, output data on the delay line 120 of buffers 110 is taken at different nodes (e.g., nodes 1 through node N) along the delay line 120 of buffers 110 by the respective latches 112, and the output from each node through its own latch 112 is coupled to a logic circuit 114 which outputs data_out 116. The nodes 1 through node N are coupled to the data inputs of the respective latches 112, while the optional clock selector 108 is coupled to clock inputs of the respective latches 112.

In one or more embodiments of the invention, the logic circuit 114 receives a bit (e.g., 0 or 1) from each latch 112 such that a string of bits forms a thermometer-coded output. The thermometer-coded output (e.g., 1100000) has a number of bits equal to the number of nodes N, where each subsequent bit is delayed by a buffer 110 in the delay line 120. When the latch circuit 112 is based on a rising edge, for one clock cycle, the logic circuit 114 determines that the clock signal 102 is captured and located at the point where a "1" transitions to a "0" in the string of bits forming the thermometer-coded output, and the logic circuit 114 determines that the clock signal 102 was captured, for example, between node 2 (with a "1") and node 3 (with a "0") corresponding to the second and third latches 112 (from left to right). For the next clock cycle, the logic circuit 114 determines that the clock signal 102 is captured and located at the point where a "1" transitions to a "0" in the string of bits forming the thermometer-coded output, and the logic circuit 114 determines that the clock signal 102 was captured, for example, between node 1 (with a "1") and node 2 (with a "0") corresponding to the first and second latches 112 (from left to right). Because the sequential captures of the clock signal 102 move from between nodes 2 and 3 to between nodes 1 and 2 (i.e., from between the second and third latches 112 to between the first and second latches 112), the logic circuit 114 is configured to determine that since the clock (signal 102) is a fixed unit of time, the delay in the chain of elements (e.g., power supply voltage sensitive delay circuit 104 and variable delay circuit 106) has increased, meaning that the value of voltage VDD has decreased. Conversely, when the sequential captures of the clock signal 102 moves from between nodes 1 and 2 to between nodes 2 and 3 (i.e., from between the first and second latches 112 to between the second and third latches 112), the logic circuit 114 is configured to determine that the delay through the chain of elements (e.g., power supply voltage sensitive delay circuit 104 and variable delay circuit 106) has decreased meaning that the value of voltage VDD has increased. As the delay increases, the capture of the clock signal 102 (with a transition from "1" to "0") at a node for a subsequent clock cycle will move earlier down the delay line 120 compared to the capture of the clock signal 102 (with a transition from "1" to "0") at a node for the previous clock cycle. Although an example scenario is provided using the rising edge, the logic circuit 114 can be configured to use the falling edge such as transitioning from "0" to "1" instead of the rising edge.

The clock signal 102 can be received from a clock buffer, a clock tree, etc. Examples of the power supply voltage sensitive delay circuit 104 are discussed further below in accordance with one or more embodiments of the invention. The variable delay circuit 106 can include logic elements, delay elements (e.g., buffers, inverters, etc.), multiplexers, which are operatively coupled to set an initial variable delay according to the clock frequency of the clock signal 102. In FIG. 1, an optional clock selector 108 (e.g., clock toggle) can serve as a method to use any number of clock cycles of delay by only allowing the clock signal 102 to make it through every 1, 2, 3, or any number of integer clock cycles. By increasing the number of clock cycles permitted by the clock selector 108, the droop detector can be made more sensitive to power supply droop since there is longer sensitive delay, at the cost of increased latency of a detection of a droop. The clock selector 108 receives, via electrical path 152, the clock signal 102, and the clock selector 108 is configured to pass the clock signal 102 to the clock inputs of latches 112 after a desired/set number of clock cycles. The clock selector 108 can include control logic, such as logic gates, for setting the desired number of clock cycles. In one or more embodiments of the invention, the optional clock selector 108 may not be present such that the clock signal 102 is directly received, via electrical path 152, at the clock inputs of latches 112. In one or more embodiments of the invention, the optional clock selector could be replaced with another logic element configured to buffer a desired number of clock cycles before passing the clock signal 102 to the latches 112.

Node 1 is shown immediately prior to the first buffer 110 (from left to right) in the delay line 120 such that first bit representing the clock signal 102 is captured by the first latch 112 (from left to right) before any delay by the first buffer 110. In one or more embodiments, node 1 could be positioned immediately after the first buffer 110. The logic circuit 114 can include logic gates, buffers, memory elements, etc., which are used to determine at which node and which latch 112 the transition from "1" to "0" has been captured in the string of bits. Based on the positioning of a previous bit having been the transition from "1" to "0" for a previous clock cycle compared to the positioning in the string of bits for the current bit having the transition from "1" to "0" for the current clock cycle, the logic circuit 114 determines whether the delay is increasing, decreasing, and/or remaining the same.

Figure 2:
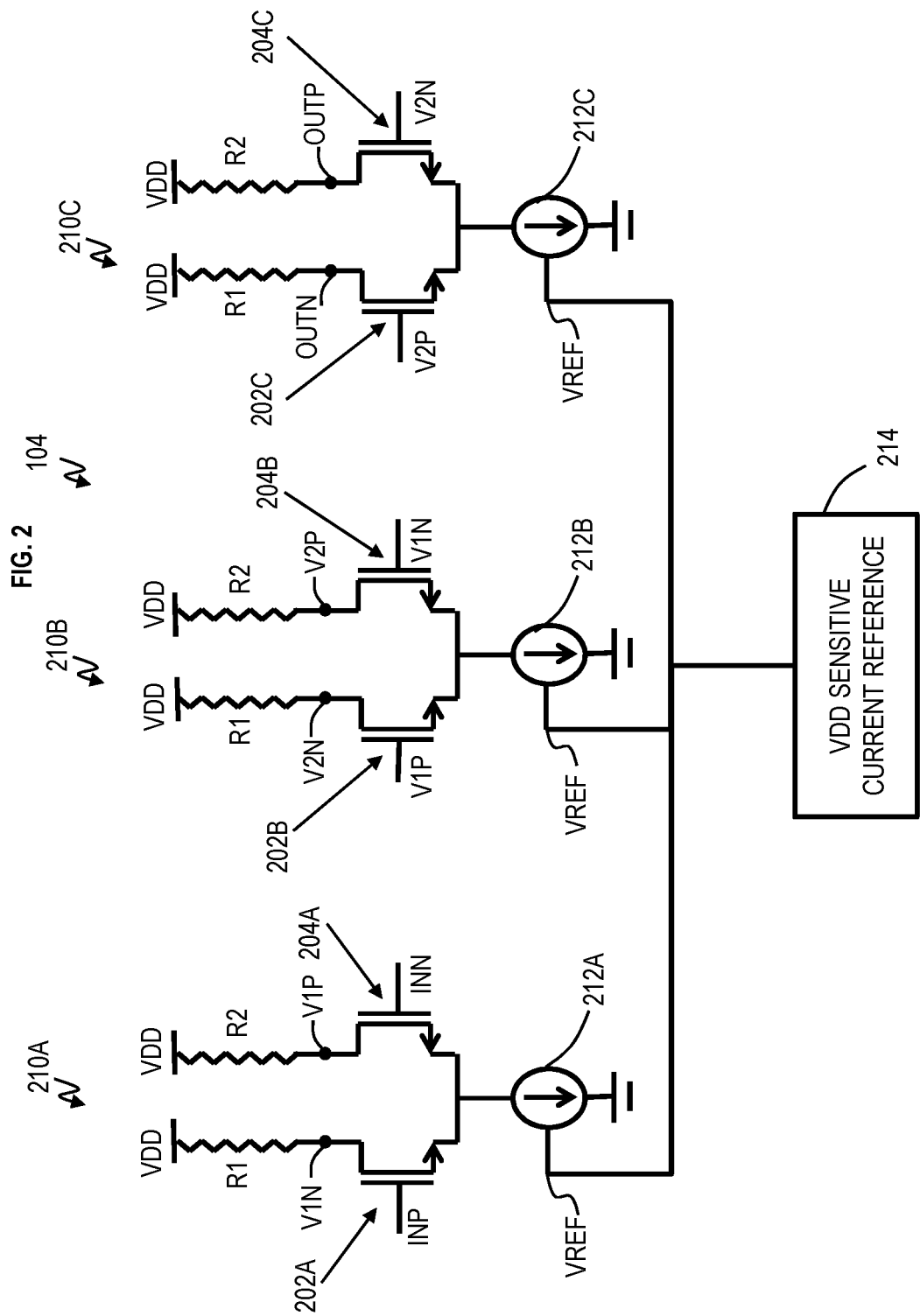
FIG. 2 illustrates a block diagram of a voltage sensitive delay circuit composed of current mode logic devices in accordance with one or more embodiments of the present invention.

FIG. 2 illustrates a block diagram of an example power supply (voltage) sensitive delay circuit 104 composed of current mode logic devices in accordance with one or more embodiments of the present invention. The power supply sensitive delay circuit 104 makes delay of the clock signal 102 more sensitive to changes in voltage of a power supply (e.g., voltage VDD) by having voltage sensitive circuits 210A, 210B, and 210C, operatively coupled together as a delay chain or oscillator. The voltage sensitive circuits 210A, 210B, and 210C can generally be referred to as voltage sensitive circuits 210. It should be appreciated that fewer or more voltage sensitive circuits may be utilized and operatively connected in FIG. 2.

The voltage sensitive circuits 210A, 210B, and 210C are CIVIL circuits. Each of the voltage sensitive circuits 210A, 210B, and 210C respectively comprises two n-type field effect transistors (NFETs), such as NFETs 202A and 204A, NFETs 202B and 204B, NFETs 202C and 204C, which are coupled together at their sources while their drains are separately connected to one end of respective resistors R1 and R2. For each voltage sensitive circuit 210A, 210B, and 210C, the other ends of the resistors R1 and R2 opposite the drains are connected to voltage VDD. In each voltage sensitive circuit 210A, 210B, and 210C, the sources of the NFETs are coupled to ground through a respective current source 212A, 212B, and 212C each of which is sensitive to changes in VDD. The current sources 212A, 212B, and 212C are each coupled to a voltage (e.g., voltage VDD) sensitive current reference module 214 in order to supply voltage reference (VREF) to each of the current sources 212A, 212B, and 212C. Further regarding the voltage sensitive current reference module 214 is discussed in FIGS. 4A, 4B, and 4C.

As current mode logic, or source-coupled logic (SCL), each voltage sensitive circuit 210A, 210B, and 210C has a differential output respectively designated as differential output V1N and V1P, differential output V2N and V2P, and differential output OUTN and OUTP; the differential output of one voltage sensitive circuit 210 couples to the gate of the next voltage sensitive circuit 210 as a differential input, thereby forming a chain of voltage sensitive circuits 210. For example, the differential output V1N and V1P of voltage sensitive circuit 210A couples to the gates (e.g., differential inputs) of NFETs 202B and 204B of voltage sensitive circuit 210B, just as the differential output V2N and V2P of voltage sensitive circuit 210B couples to the gates of NFETs 202C and 204C of voltage sensitive circuit 210C. A differential signal (e.g., such as the clock signal 102 as a differential signal) input at differential inputs INP and INN of voltage sensitive circuit 210A is output at differential outputs OUTN and OUTP of voltage sensitive circuit 210C according to one or more embodiments of the invention.

Although the voltage sensitive circuits 210 are illustrated with NFETs, it should be appreciated that p-type field effect transistors (PFETs) can be utilized as depicted in the embodiment shown in FIG. 5. FIG. 5 illustrates a voltage sensitive circuit 510 as a CML circuit, and each of the voltage sensitive circuits 210A, 210B, and 210C can be separately replaced with the voltage sensitive circuit 510 and analogously connected to form a delay chain as discussed in FIG. 2. In FIG. 5, voltage sensitive circuit 510 includes two PFETs 502 and 504 coupled together at their sources while their drains are separately connected to one end of respective resistors R1 and R2. For voltage sensitive circuit 510, the other ends of the resistors R1 and R2 opposite the drains are connected to ground. The sources of the PFETs 502 and 504 are coupled to voltage VDD through a current source 512 sensitive to changes in voltage VDD. The current source 512 receives VREF from the voltage VDD voltage sensitive current reference module 214, as discussed for current sources 212A, 212B, and 212C. The voltage sensitive circuit 510 has a differential output designated as differential output V1N and V1P and gate inputs designated as V1N and V1P. For three voltage sensitive circuits 510 connected in a delay chain, the differential output of one voltage sensitive circuit 510 is connected to the gates of the next voltage sensitive circuit 510 in a manner such as that discussed above in reference to FIG. 5.

Turning to FIG. 3, an example power supply (voltage) sensitive delay circuit 104 is illustrated for providing voltage sensitive delay in accordance with one or more embodiments of the present invention. As discussed in FIG. 2, the power supply sensitive delay circuit 104 in FIG. 3 is a delay circuit which makes delay of the clock signal 102 more sensitive to changes in voltage of a power supply (e.g., voltage VDD) by having voltage sensitive circuits 310A, 310B, and 310C operatively coupled together as a delay chain. The voltage sensitive circuits 310A, 310B, and 310C are generally referred to as voltage sensitive circuits 310 and can include inverters or passgates which are current controlled. It should be appreciated that fewer or more voltage sensitive circuits may be utilized and operatively connected in FIG. 3.

Each voltage sensitive circuit 310A, 310B, and 310C includes inverters formed with the input of one inverter coupled to the output of the next inverter, and each inverter is formed of a PFET coupled to an NFET, such as PFET 302A coupled to NFET 304A, PFET 302B coupled to NFET 304B, and PFET 302C coupled to NFET 304C. For each inverter, the source of the PFET is coupled to voltage VDD and the source of the NFET is coupled to respective current sources 212A, 212B, and 212C sensitive to voltage VDD for each of the voltage sensitive circuits 310; the drains and gates of the PFET and NFET are coupled together. Although not shown, it should be appreciated that the current sources 212A, 212B, and 212C may be moved from the source of the NFETs to the source of the PFETS in voltage sensitive circuits 310A, 310B, and 310C while still functioning in accordance with embodiments. If the current sources 212A, 212B, and 212C are moved from NFET to PFET, the source of the PFET can be coupled to voltage VDD through the current source sensitive to voltage VDD, and the source of the NFET can be coupled to ground, while their drains and gates are coupled together. Regardless of which end of the inverters that the current sources 212A, 212B, and 212C are connected to, embodiments of the invention provide current controlled inverters where the delay is controlled by the current and that current is made sensitive to voltage VDD.

As discussed herein, the VDD voltage sensitive current reference module 214 is coupled to the current sources 212A, 212B, 212C, and 512 (in FIG. 5) along with the voltage supply of voltage VDD. The current sources sensitive to voltage VDD can be implemented as an NFET or PFET. For example, the VDD voltage sensitive current reference module 214 outputs a voltage VREF to the gate of the current source (i.e., using the NFET as the current source) according to the changes in voltage VDD, such that the current through the current source is sensitive/responsive to changes in voltage VDD, meaning that the current increases or decreases according to the voltage VDD. The VDD voltage sensitive current reference module 214 is coupled to voltage VDD so as to control changes in the voltage to the gate of the current source (i.e., using NFET as the current source), and the VDD voltage sensitive current reference module 214 outputs a lower value for voltage VREF when voltage VDD decreases and outputs a higher value for voltage VREF when VDD increases. Therefore, a drop in voltage VDD slows the circuits 100 and 104 which increase delay, while an increase in voltage VDD speeds up the circuits 100 and 104 which decrease the delay.

Figure 4B:
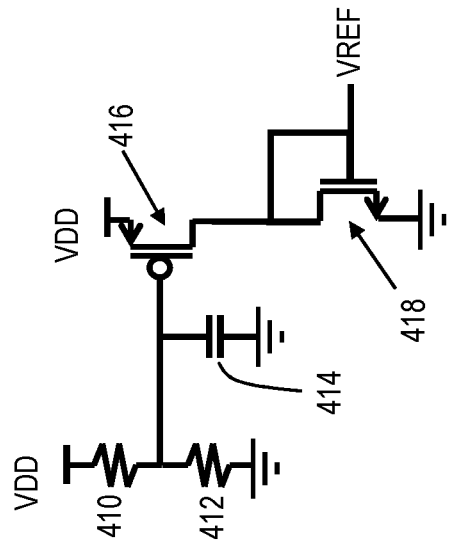
FIG. 4B illustrates a block diagram of a voltage sensitive current reference in accordance with one or more embodiments of the present invention.
Figure 4A:
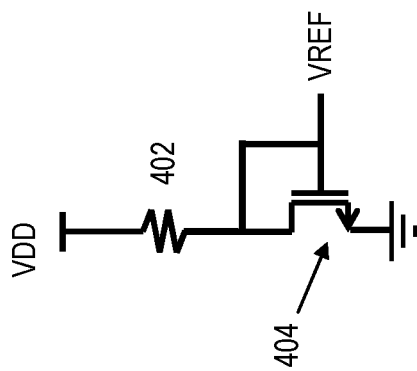
FIG. 4A illustrates a block diagram of a voltage sensitive current reference in accordance with one or more embodiments of the present invention.
Figure 4C:
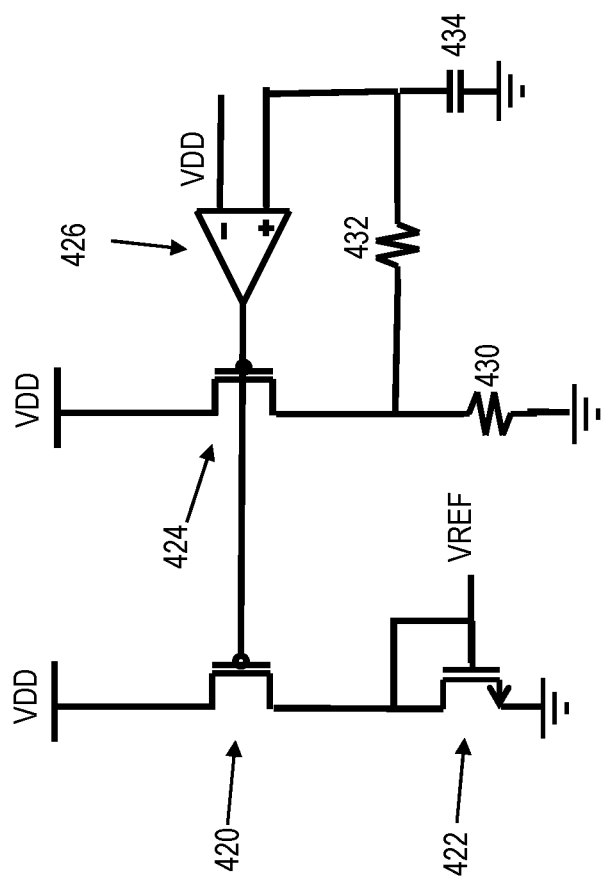
FIG. 4C illustrates a block diagram of a voltage sensitive current reference in accordance with one or more embodiments of the present invention.

Example VDD sensitive current reference modules in accordance with one or more embodiments of the invention are illustrated in FIGS. 4A, 4B, and 4C. FIG. 4A illustrates an example VDD voltage sensitive current reference module 214 with an NFET 404 having its drain coupled to voltage VDD through a resistor 402. The gate and drain of NFET 404 are coupled at a node which also outputs voltage VREF. The source of NFET 404 is coupled to ground.

FIG. 4B illustrates an example VDD voltage sensitive current reference module 214 with a PFET 416 and NFET 418 coupled at their drains for a node, while the gate and drain of the NFET 418 are also coupled to the node in order to output voltage VREF. Resistors 410 and 412 are connected in series, and the gate of PFET 416 is coupled to the connected ends of resistors 410 and 412 along with capacitor 414. The opposite end of capacitor 414 is connected to ground. The opposite end of resistor 410 is connected to voltage supply (e.g., voltage VDD) while the opposite end of resistor 412 is connected to ground.

FIG. 4C illustrates an example VDD voltage sensitive current reference module 214 with an amplifier 426 (e.g., an operational amplifier) having its output coupled to gates of PFET 420 and PFET 424. The inverting input terminal (−) of amplifier 426 is coupled to voltage supply (e.g., voltage VDD), while the noninverting input (+) is coupled to a node connecting resistor 432 and capacitor 434. The opposite end of capacitor 434 is coupled to ground. One end (e.g., source) of PFET 424 is coupled to a power supply (e.g., voltage VDD), and the opposite end (e.g., drain) of PFET 424 is coupled to a node connecting resistor 432 and resistor 430. The opposite end of resistor 430 is connected to ground. One end (e.g., source) of PFET 420 is coupled to voltage supply (e.g., voltage VDD), while the other end (e.g., drain) is coupled to a node connecting the gate and drain of the NFET 422 in which this node outputs voltage VREF, as illustrated in FIG. 4C.

As an example scenario for operating power supply sensitive delay circuit 104 in FIG. 2, a differential signal of clock signal 102 applied to differential inputs INP and INN is delayed through each of voltage sensitive circuits 210A, 210B, and 210C dependent on the reference current supplied by current sources 212A, 212B, and 212C. A decrease in voltage VREF from the VDD sensitive current reference 214 leads to a subsequent decrease in the current provided by current sources 212A, 212B, and 212C. This decrease in current increases the time taken to charge and discharge each of the differential NFET pairs, INN and INP, V1N and V1P, V2N and V2P, which results in an increase in delay through each of the voltage sensitive circuits 210A, 210B, and 210C. Conversely an increase in the VREF voltage increases the current by current sources 212A, 212B, and 212C which then decreases the charging and discharging time of each of differential NFET pairs and decreases the delay through each of circuits 210A, 210B, and 210C.

As an example scenario for operating power supply sensitive delay circuit 104 in FIG. 3, a signal at input IN of voltage sensitive circuit 310A is delayed through each of voltage sensitive circuits 310A, 310B, and 210C dependent on the reference current supplied by current sources 212A, 212B, and 212C. A decrease in voltage VREF from the VDD sensitive current reference 214 leads to a subsequent decrease in the amount of current available to NFET devices 304A, 304B, and 304C, to discharge the drains of voltage sensitive circuits 310A, 310B, and 310C, respectively. As less current is available, the drains of NFET devices 304A, 304B, and 304C discharge more slowly which in turn also delays the turning on of the respective PFET in the proceeding stage. Consequently, a decrease in the VREF voltage increases the delay through each of circuits 310A, 310B, and 310C. Conversely, an increase in the VREF voltage decreases the delays through each of circuits 310A, 310B, and 310C.

FIG. 6 illustrates a flow diagram of a method 600 for configuring the power supply sensitive delay circuit 104 in FIGS. 2 and 3 in accordance with one or more embodiments of the invention. Reference can be made to FIGS. 1, 2, 3, 4A, 4B, 4C, and 5 discussed herein. At block 602, the method 600 includes forming a first voltage sensitive circuit (e.g., voltage sensitive circuits 210A and 310A) including first transistors (e.g., NFETs 202A and 204A in FIG. 2 and PFET 302A and NFET 304A in FIG. 3), the first transistors being coupled together so as to be operatively coupled to a first current source (e.g., current source 212A). At block 604, the method 600 includes forming a second voltage sensitive circuit (e.g., voltage sensitive circuits 210B and 310B) including second transistors (e.g., NFETs 202B and 204B in FIG. 2 and PFET 302B and NFET 304B in FIG. 3), the second transistor being coupled together so as to be operatively coupled to a second current source (e.g., current source 212B), the first voltage sensitive circuit being coupled to the second voltage sensitive circuit to form a delay chain, the first and second current sources being sensitive/responsive to changes in voltage of a power supply (e.g., voltage VDD) according to a voltage reference (e.g., VREF). At block 606, the method 600 includes coupling a voltage sensitive current reference module 214 to the first and second current sources (e.g., current sources 212A, 212B, etc.), the voltage sensitive current reference module 214 being configured to supply the voltage reference (e.g., VREF) to the first and second current sources, the voltage sensitive current reference module being sensitive/responsive to changes in the voltage of the power supply (e.g., voltage VDD).

In accordance with one or more embodiments of the invention, each of the first transistors is an n-type field effect transistor (NFET) and each of the second transistors is an NFET, as illustrated in FIG. 2. The first transistors are first NFETs having sources coupled to the first current source and the second transistors are second NFETs having sources coupled to the second current source. The first voltage sensitive circuit (e.g., voltage sensitive circuits 210A) comprises a first differential output (e.g., differential output V1N and V1P) and the second voltage sensitive circuit (e.g., voltage sensitive circuits 210B) comprises a second differential output (e.g., differential output V2N and V2P). The first differential output couples to gates of the second transistors, and the second differential output couples to gates of the first transistors, for example, assuming two voltage sensitive circuits. However, it should be appreciated that more than two voltage sensitive circuits can be utilized to form a delay chain. The first voltage sensitive circuit includes first resistor elements (e.g., resistor R1 and R2) coupled to the first transistors (e.g., NFETs 202A and 204A) and the second voltage sensitive circuit incudes second resistor elements (e.g., resistors R1 and R2) coupled to the second transistors (e.g., NFETs 202B and 204B).

In accordance with one or more embodiments of the present invention, the voltage sensitive current reference module 214 is configured to output a lower value for the voltage reference (e.g., VREF) in response to a decrease in the voltage of the power supply (e.g., voltage VDD), thereby increasing a delay. The voltage sensitive current reference module 214 is configured to output a higher value for the voltage reference (e.g., VREF) in response to an increase in the voltage of the power supply, thereby decreasing a delay.

In accordance with one or more embodiments of the present invention, the first voltage sensitive circuit (e.g., voltage sensitive circuits 310A) includes a first inverter and the second voltage sensitive circuit (e.g., voltage sensitive circuits 310B) includes a second inverter coupled to the first inverter, as illustrated in FIG. 3. The first inverter is coupled to the first current source (e.g., current source 212A) and the second inverter is coupled to the second current source (e.g., current source 212B), as illustrated in FIG. 3. The first inverter and the second inverter each include a PFET (e.g., PFETs 302A, 302B) coupled to an NFET (e.g., NFETs 304A, 304B).

Turning now to FIG. 7, an example power supply sensitive delay circuit 104 for providing voltage sensitive delay is generally shown in accordance with one or more embodiments of the present invention. The power supply sensitive delay circuit 104 is a delay circuit which makes delay more sensitive to changes in voltage VDD of a power supply by having voltage starved passgates or transmission gates with IR (current (I) multiplied by resistance (R)) drop (down or up). Particularly, the power supply sensitive delay circuit 104 in FIG. 7 includes passgates or transmission gates 704 which include a p-type field effect transistor (PFET) 712A (having more holes than electrons) and an n-type field effect transistor (NFET) 712B (having more electrons than holes) coupled together at their drains and sources. Their drains are coupled to a delay element 702 which passes a the clock signal 102. The delay element 702 may be an inverter which includes a PFET 710A coupled to an NFET 710B operating in a manner known to those skilled in the art. In some embodiments, the delay element 702 is a buffer or another type of delay element. In other embodiments, the delay element 702 is a logic circuit.

In the passgates or transmission gates 704, the gate of the PFET 712A is coupled to a first node 724. The first node 724 is coupled to the output of a current source 720 and one end of a first resistor 722, while the other end of the first resistor 722 is connected to ground. The gate of the NFET 712B is coupled to a second node 734. The second node 734 is coupled to one end of a second resistor 732 while the opposite end of the second resistor is coupled to power supply (VDD) which is the voltage source being monitored. The second node 734 is coupled to the input of a current source 730. The first resistor 722 may have a resistance value R1 and the second resistor 732 may have a resistance value R2. The current source 720 may have a current value I1 and the current source 730 may have a current value I2. In some examples, R1=R2 and I1=I2. In some examples, R1 is greater than R2 or vice versa. In some example, I1 is greater than I2 or vice versa.

A clock signal 102 is received at an input node 760 and output at an output node 765. The power supply sensitive delay circuit 104 (in FIGS. 7, 8, 9, 10A, and 10B) makes delay in the clock signal 102 more sensitive to changes in voltage VDD of the power supply. The power supply sensitive delay circuit 104 is faster as the voltage VDD of power supply increases, meaning the delay of clock signal 102 passing from input node 760 to output node 765 decreases as the voltage VDD of power supply increases. The power supply sensitive delay circuit 104 becomes slower as the voltage VDD of power supply decreases (i.e., voltage drops), meaning the delay of clock signal 102 passing from input node 760 to output node 765 increases as the voltage VDD of power supply decreases.

Turning now to FIG. 8, an example power supply sensitive delay circuit 104 for providing voltage sensitive delay is generally shown in accordance with one or more embodiments of the present invention. Instead of both the PFET 712A and NFET 712B being tied together and connected to the delay element 702 as shown in FIG. 7, FIG. 8 illustrates the PFET 712A and NFET 712B being separately connected to the delay element 702. As can be seen in FIG. 8, the passgates/transmission gates 704 are folded into the inverter (i.e., delay element 702) itself where the PFET 712A coupled to the first node 724 is connected between the inverter of PFET 710A and output node 765, and the NFET 712B connected to the second node 734 is connected between the inverter of NFET 710B and the output node 765. FIGS. 7 and 8 include the same elements, and both examples can function the same as discussed herein to carry out embodiments of the invention. Accordingly, discussion of FIG. 7 applies by analogy to FIG. 8 and vice versa.

In contemporary PFET and NFET connections for passgates/transmission gates, the gate of the PFET is connected directly to ground and the gate of the NFET is connected directly to a power supply supplying voltage VDD in order to turn both transistors on as strongly as possible. However, in the power supply sensitive delay circuit 104 shown in FIGS. 7 and 8, the passgates or transmission gates have an increased delay since they are not turned on strongly. Therefore, a droop in the voltage (power) is more sensitive because the gate connected at the second node 734 is at a value lower than the value of voltage VDD of the power supply and because the gate connected at first node 724 is at a value higher than the value of ground (e.g., typically 0 volts for illustration purpose). Particularly, in accordance with one or more embodiments of the present invention, instead of the PFET 712A being connected to ground, the gate of PFET 712A is connected to the first node 724 which has a voltage relationship of the current I1 from the current source 720 times resistance R1 of the first resistor 722, thereby creating a voltage drop up (I1×R1) from the value of ground. Similarly, instead of the NFET 712B being to connected to voltage VDD, the gate of NFET 712B is connected to the second node 734 which has a voltage relationship of the current I2 from the current source 730 times resistance R2 of the second resistor 732, thereby creating a voltage drop down (I2×R2) from the value of voltage VDD of the power supply. Ground can be a voltage or potential at 0 volts, and in some cases, ground can be some represented as VSS or the most negative voltage. The voltage VDD of the power supply is the most positive voltage (e.g., 1 volt). The power supply sensitive delay circuit 104 is configured to determine when the value of the voltage VDD of the power supply drifts towards the value of the ground voltage/ground potential (VSS), and this drift is referred to a voltage droop.

Further, it should be noted that it is not just that the passgates or transmission gates 704 are connected to a different node that makes the delay sensitive to power supply (VDD). It is also that the power supply sensitive delay circuit 104 is using an I×R voltage drop down from voltage VDD (on the power rail) where current I1 represents current I and resistance R1 represents R in the NFET case and using an I×R voltage drop up from ground where current I2 represents current I and resistance R2 represents R in the PFET case; both the NFET and PFET cases make the delay extra sensitive to voltage VDD movements. This is because with an I×R voltage drop as opposed to a resistor divider, the gate voltage will move with a 1:1 (one-to-one) ratio with movements of the value of voltage VDD in one or more embodiments of the invention, depicted in FIGS. 7 and 8. However, in a resistor divider, the gate voltage would only move by a fraction of the power supply. Thus, the design of the power supply sensitive delay circuit 104 in FIGS. 7 and 8 in one or more embodiments of the invention is more sensitive to changes in voltage VDD of the power supply than state-of-the-art circuits. As an additional feature, the current in the current source itself, such as current sources 720 and 730, can be sensitive to movements in the voltage VDD of the power supply for even more delay change when the power supply moves.

As noted above, the gate connections of the passgates or transmission gates 704 make the PFET 712A and NFET 712B more sensitive to voltage drops of voltage VDD of the power supply. After a clock signal 102 is input to the delay element 702, the clock signal 102 arrives from the delay element 702 (e.g., an inverter) to the PFET 712A and NFET 712B, and the delay (i.e., additional time) in turning on (transistors) PFET 712A and NFET 712B increases the delay in passing the clock signal 102, thereby, detecting decreases in voltage VDD because of the added delay. Both (transistors) PFET 712A and NFET 712B are turned on by their respective gate voltage and are trying to pass signals which cause their own delay. Instead of reducing resistance with resistor divider, one or more embodiments of the invention use I×R voltage drop (up and/or down) to maintain full power supply sensitivity while still starving the passgates or transmission gates 704 of voltage.

FIG. 9 illustrates a block diagram of an example system 900 of power supply sensitive delay circuits 104 coupled together in a daisy chain according to one or more embodiments of the invention. Each power supply sensitive delay circuit 104 is sensitive to changes in voltage VDD (and ground voltage), and each power supply sensitive delay circuit 104 adds further delay to when passing the clock signal 102.

Figure 10A:
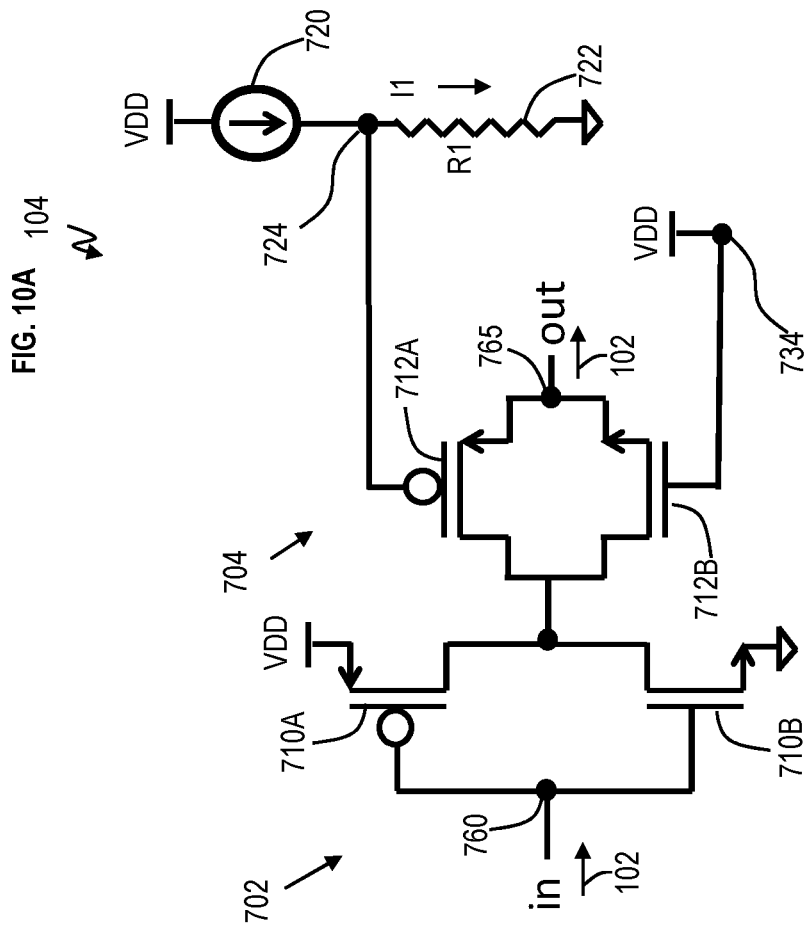
FIG. 10A illustrates a block diagram of an example circuit in accordance with one or more embodiments of the present invention.
Figure 10B:
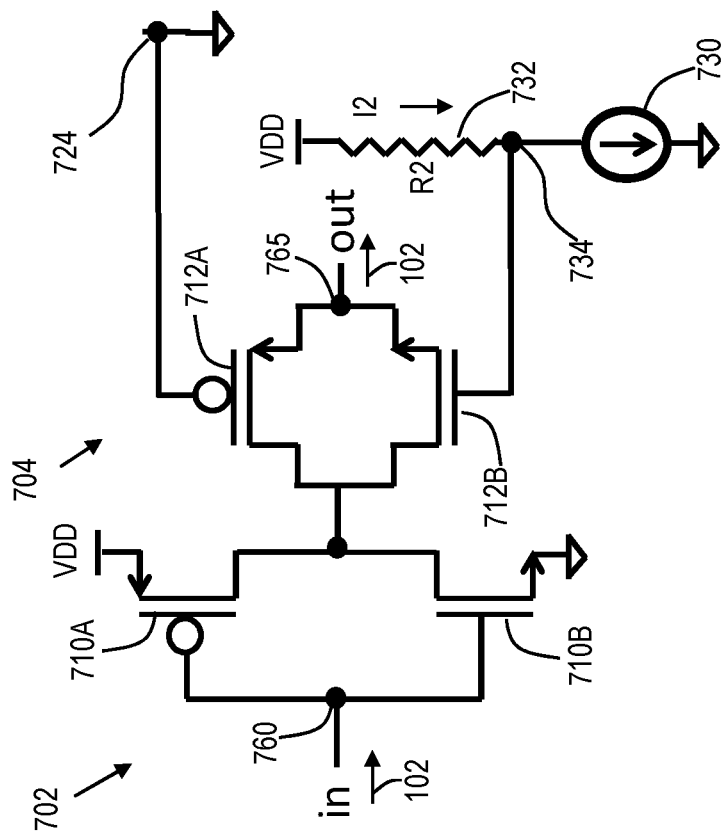
FIG. 10B illustrates a block diagram of an example circuit in accordance with one or more embodiments of the present invention.

There can be modifications to the connections for the gates of the passgates or transmission gates 704 as discussed below in FIGS. 10A and 10B. FIG. 10A illustrates the power supply sensitive delay circuit 104 of FIG. 7 with a modification to the passgates or transmission gates 704 in which the second resistor 732 and current source 730 are removed according to one or more embodiments. In FIG. 10A, the gate of the NFET 712B is coupled directly to voltage VDD of the power supply. FIG. 10B illustrates the power supply sensitive delay circuit 104 of FIG. 7 with a modification to the passgates or transmission gates 704 in which the first resistor 722 and current source 720 are removed according to one or more embodiments. In FIG. 10B, the gate of the PFET 712A is coupled directly to ground. FIG. 10A is tuned to detecting changes in the ground voltage, while FIG. 10B is tuned to detecting changes in voltage VDD of the power supply.

FIG. 11 illustrates a flow diagram of a method 1100 for configuring the power supply sensitive delay circuit 104 of FIGS. 7 and 8 in accordance with one or more embodiments of the invention. Reference can be made to FIGS. 1, 7, 8, 9, 10A, and 10B. At block 1102, passgates or transmission gates 704 are coupled to a delay element 702, the passgates or transmission gates 704 comprising a first transistor (e.g., PFET 712A) and a second transistor (e.g., NFET 712B). At block 1104, a first node 724 is coupled to a first gate of the first transistor (e.g., PFET 712A), a first current source 720, and a first resistive element (e.g., resistor 722), an opposite end of the first resistive element (e.g., resistor 722) being coupled to a ground potential. At block 1106, a second node 734 is coupled to a second gate of the second transistor (e.g., NFET 712B), a second current source 730, and a second resistive element (e.g., resistor 732), an opposite end of the second resistive element (e.g., resistor 732) being coupled to voltage VDD of the power supply.

The first resistive element (e.g., resistor 722) is configured to cause a delay in powering on the first transistor (e.g., PFET 712A) according to an increase in the ground potential. The first resistive element (e.g., resistor 722) is configured to cause a delay in powering on the first transistor (e.g., PFET 712A), an amount of the delay being in direct relation to a magnitude of an increase in the ground potential.

The second resistive element (e.g., resistor 732) is configured to cause a delay in powering on the second transistor (e.g., NFET 712B) according to a decrease in voltage VDD of the power supply. The second resistive element (e.g., resistor 732) is configured to cause a delay in powering on the second transistor (e.g., NFET 712B), an amount of the delay being in direct relation to a magnitude of a decrease in a voltage VDD supplied by the power supply.

The first transistor (e.g., PFET 712A) is configured to be powered on by a logical low voltage supplied by the ground potential. The first resistive element (e.g., resistor 722) is configured to cause the first gate to receive a voltage drop up from the ground potential, so as to be greater than the logical low voltage. The voltage drop up is based on current I1 from the first current source 720 and resistance of the first resistive element (e.g., resistor 722), and the first transistor (e.g., PFET 712A) is configured to be powered off by a logical high voltage (e.g., 1 V) which is greater than the logical low voltage (0 V). The voltage drop up is configured to cause a delay in powering on the first transistor (e.g., PFET 712A), an amount of the delay being in direct relation to a magnitude of an increase in the ground potential. In other words, the voltage drop up causes the PFET 712A to power on slower than if the gate of the PFET 712A were connected directly to ground; when the ground voltage of ground rises, the voltage drop up results in a larger rise in ground voltage/ground potential, thereby causing the PFET 712A to turn on even slower than if its gate were directly connected to ground. This results in a delay in passing the clock signal 102, and the delay increases as the ground potential/ground voltage increases.

The second transistor (e.g., NFET 712B) is configured to be powered on by a logical high voltage (e.g., 1 V) supplied by the power supply, and the second resistive element (e.g., resistor 732) is configured to cause the second gate to receive a voltage drop down from the power supply, so as to be less than the logical high voltage. The voltage drop down is based on current I2 from the second current source 730 and resistance of the second resistive element (e.g., resistor 732). The second transistor (e.g., NFET 712B) is configured to be powered off by a logical low voltage (e.g., 0 V) which is less than the logical high voltage. The voltage drop down is configured to cause a delay in powering on the second transistor (e.g., NFET 712B), an amount of the delay being in direct relation to a magnitude of a decrease in (voltage from) the power supply. In other words, the voltage drop down causes the NFET 712B to power on slower than if the gate of the NFET 712B were connected directly to the power supply; when the voltage of the power supply decreases, the voltage drop down results in a larger decrease in voltage of power supply, thereby causing the NFET 712B to turn on even slower than if its gate were directly connected to power supply. This results in a delay in passing the clock signal 102, and the delay increases as the voltage of power supply decreases.

Figure 12:
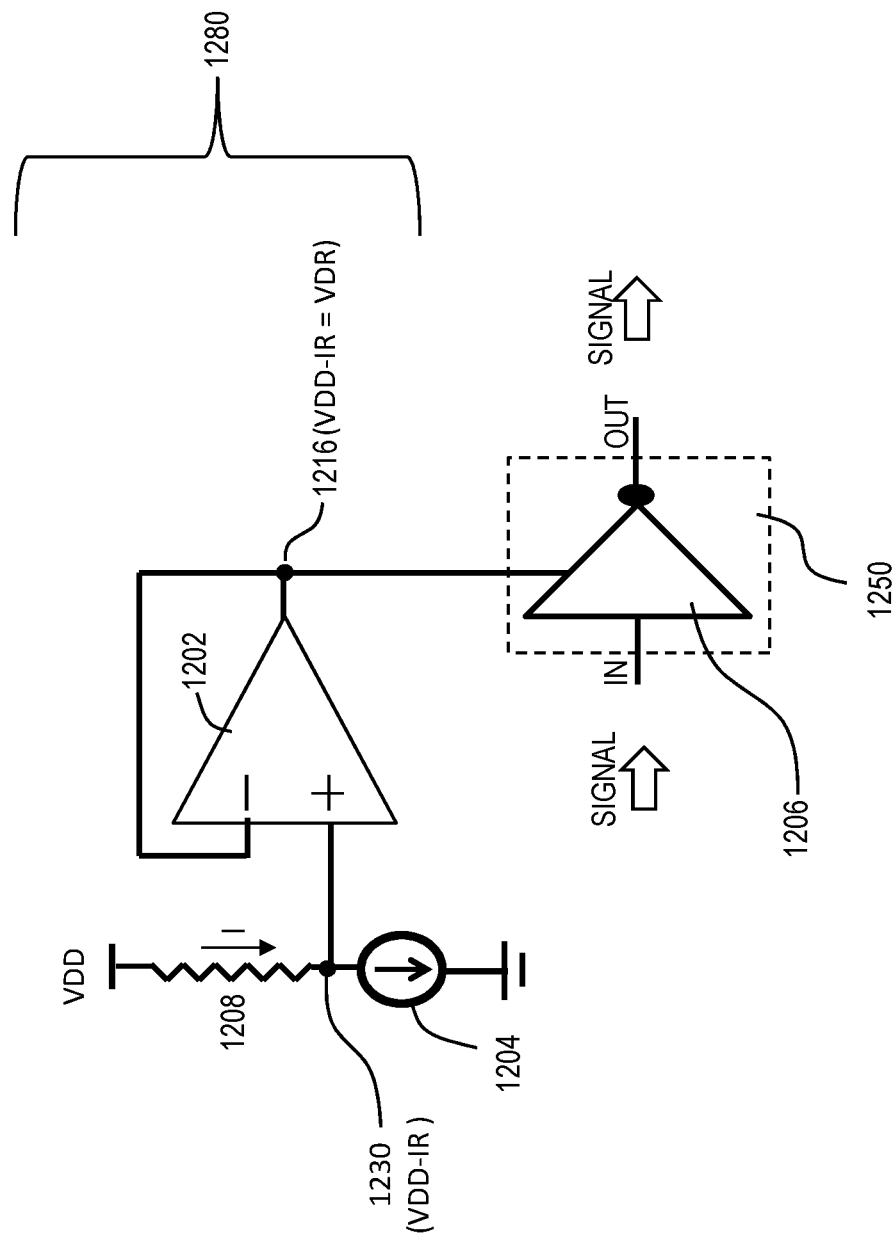
FIG. 12 illustrates a block diagram of an example circuit in accordance with one or more embodiments of the present invention.

Turning now to FIG. 12, an example power supply sensitive delay circuit 104 for providing voltage sensitive delay is generally shown in accordance with one or more embodiments of the present invention. The power supply sensitive delay circuit 104 is a delay circuit which makes delay more sensitive to changes in voltage of a power supply (e.g., voltage VDD) by having voltage sensitive circuit 1250 controlled by changes in a voltage VDR at a voltage-dependent rail identified as node 1216. The voltage sensitive circuit 1250 includes a delay element 1206 coupled to a power circuit 1280. Although the delay element 1206 is illustrated as an inverter (e.g., a NOT gate), it should be appreciated that other types of logic gates can be utilized. Although one delay element 1206 is illustrated in FIG. 12, it should be appreciated that more delay elements can be utilized and operatively connected in FIG. 12 with each having its input connected to the output of the next delay element 1206, thereby forming a chain of delay elements 1206 or forming a ring oscillator.

As seen in FIG. 12, the power supply sensitive delay circuit 104 includes a power circuit 1280 configured to sense a drop (or change) on primary power supply (e.g., voltage VDD) while translating the change in voltage VDD using a resistor 1208 and current source 1204 coupled to an operational amplifier 1202. The operational amplifier 1202 has its noninverting/positive (+) input terminal connected to node 1230. The node 1230 connects to one end of resistor 1208 and to the input of current source 1204. The other end of resistor 1208 is connected to a voltage supply to receive voltage VDD. A voltage drop of voltage VDD minus I*R (resistance (R) times current (I)) occurs at node 1230 (e.g., VDD−IR). The inverting/negative (−) input terminal and output terminal of operational amplifier 1202 are connected together at node 1216, which can be considered a voltage-dependent rail, to supply voltage VDR. The operational amplifier 1202 is configured to reflect or duplicate the voltage at the noninverting/positive (+) input terminal to its output terminal, such that node 1216 has voltage VDR where VDR=VDD−IR. Node 1216 is connected to delay element 1206, thereby supplying voltage VDR to the delay element 1206.

In FIG. 12, by the resistor 1208 and current (I) causing the voltage drop down from voltage VDD and by the operational amplifier 1202 reflecting the voltage VDR to its output at node 1216, a drop in voltage VDD of the power supply is seen as an even larger percentage voltage drop at voltage VDR at node 1216 by voltage sensitive circuit (inverter) 1250, thereby increasing the delay in the delay element 1206 by a larger percentage as compared to any delay caused without adding the additional drop in voltage VDD. By using the current source 1204 rather than a resistor divider for the voltage reference at node 1230, any change in the power supply is directly transferred to the reference voltage, rather than only a ratio of the change. The current source 1204 may also be set to be a voltage sensitive current (sensitive to changes in voltage VDD), thereby increasing the sensitivity further. A signal through delay element 1206 of voltage sensitive circuit 1250 has a delay that is in direct relation to the change in voltage VDD. Particularly, a change in voltage VDD is duplicated onto the lower value voltage VDR, such that the change is a larger percentage of the voltage VDR as compared to the change relative to the power supply VDD. Therefore, the delay element will either decrease or increase delay more than if it were coupled to the power supply (e.g., voltage VDD).

FIG. 13 illustrates a flow diagram of a method 1300 for configuring or forming the power supply sensitive delay circuit 104 in FIG. 12 in accordance with one or more embodiments of the present invention. At block 1302, the method 1300 includes forming a power circuit (e.g., power circuit 1280) including an amplifier (e.g., operational amplifier 1202), a resistor (e.g., resistor 1208), a current source (e.g., current source 1204), and a first node (e.g., node 1230), one end of the resistor being coupled to a first voltage (e.g., voltage VDD), the first node being coupled to an opposite end of the resistor, a first input terminal (e.g., noninverting/positive terminal (+)) of the amplifier, and the current source, wherein the first node has a second voltage (e.g., voltage VDR). At block 1304, the method 1300 includes coupling a voltage sensitive circuit (e.g., voltage sensitive circuit 1250) including a logic gate (e.g., delay element 1206) to both a second input terminal (e.g., inverting/negative terminal (−)) of the amplifier and an output terminal at a second node (e.g., node 1216), the voltage sensitive circuit being configured to provide an output based on the second voltage, the voltage sensitive circuit being configured to modulate a delay in the output based on a difference between the first voltage and the second voltage.

FIG. 14 illustrates a flow diagram of a method 1400 for configuring a circuit 100 which is a voltage droop detection circuit in accordance with one or more embodiments of the present invention. Reference can be made to FIGS. 1-13. At block 1402, the power supply sensitive delay circuit 104 is coupled to the variable delay circuit 106. At block 1404, a delay line 120 is coupled to the variable delay circuit 106. At block 1406, a logic circuit 114 coupled to the delay line 120.

According to one or more embodiments, the power supply sensitive delay circuit 104 is configured to increase or decrease delay (of the clock signal 102) in accordance with a change in voltage VDD. Latches 112 couple the delay line 120 to the logic circuit 114. The latches 112 are configured to couple to the delay line 120 at different nodes (e.g., nodes 1-N). The logic circuit 114 is configured to determine a delay in accordance with positions of the latches 112. The logic circuit 114 is configured to receive bits (e.g., a string of bits) from the latches 112, the bits corresponding to the positions (e.g., first, second third, etc., from left to right) of the latches 112. The positions of the latches 112 correspond (e.g., in a one-to-one relationship) to nodes (e.g., nodes 1-N from left to right) along the delay line 120. The delay line 120 comprises delay elements (e.g., buffers 110).

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A circuit comprising:
a power supply sensitive delay circuit comprising a first voltage sensitive circuit having a first current source and a second voltage sensitive circuit having a second current source, wherein a voltage sensitive current reference module is coupled to the first and second current sources and configured to supply a voltage reference to the first and second current sources, the voltage sensitive current reference module being responsive to changes in a voltage of a power supply;
a variable delay circuit coupled to the power supply sensitive delay circuit;
a delay line coupled to the variable delay circuit; and
a logic circuit coupled to the delay line.

2. The circuit of claim 1, wherein the power supply sensitive delay circuit is configured to increase or decrease delay in accordance with a change in voltage.

3. The circuit of claim 1, further comprising latches coupling the delay line to the logic circuit.

4. The circuit of claim 3, wherein the latches are configured to couple to the delay line at different nodes.

5. The circuit of claim 4, wherein the logic circuit is configured to determine a delay in accordance with positions of the latches.

6. The circuit of claim 5, wherein the logic circuit is configured to receive bits from the latches, the bits corresponding to the positions of the latches.

7. The circuit of claim 5, wherein the positions of the latches correspond to nodes along the delay line.

8. The circuit of claim 1, wherein the delay line comprises delay elements.

9. The circuit of claim 1, wherein:
the first voltage sensitive circuit comprises first transistors, the first transistors being coupled together so as to be operatively coupled to the first current source;
the second voltage sensitive circuit comprises second transistors, the second transistors being coupled together so as to be operatively coupled to the second current source, the first voltage sensitive circuit being coupled to the second voltage sensitive circuit to form a delay chain, the first and second current sources being responsive to changes in the voltage of the power supply according to the voltage reference.

10. A method of forming a circuit, the method comprising:
coupling a power supply sensitive delay circuit to a variable delay circuit;
coupling a delay line to the variable delay circuit; and
coupling a logic circuit to the delay line, wherein the power supply sensitive delay circuit comprises:
  a power circuit comprising an amplifier, a resistor, a current source, and a first node, one end of the resistor being configured to couple to a power supply, the first node being coupled to an opposite end of the resistor, a first input terminal of the amplifier, and the current source; and
  a voltage sensitive circuit comprising a logic gate coupled to both a second input terminal of the amplifier and an output terminal of the amplifier at a second node.

11. The method of claim 10, wherein the power supply sensitive delay circuit is configured to increase or decrease delay in accordance with a change in voltage.

12. The method of claim 10, wherein latches couple the delay line to the logic circuit.

13. The method of claim 12, wherein the latches are configured to couple to the delay line at different nodes.

14. The method of claim 12, wherein the logic circuit is configured to determine a delay in accordance with positions of the latches.

15. The method of claim 14, wherein the logic circuit is configured to receive bits from the latches, the bits corresponding to the positions of the latches.

16. The method of claim 14, wherein the positions of the latches correspond to nodes along the delay line.

17. The method of claim 10, wherein the delay line comprises delay elements.

18. A circuit comprising:
a power supply sensitive delay circuit;
a variable delay circuit coupled to the power supply sensitive delay circuit;
a delay line coupled to the variable delay circuit;
a logic circuit coupled to the delay line via latches; and
a clock selector coupled to the latches, wherein the power supply sensitive delay circuit comprises:
  a transmission gate coupled to a delay element and comprising a first transistor and a second transistor;
  a first node coupled to a first gate of the first transistor, a first current source, and a first resistive element, an opposite end of the first resistive element being coupled to a ground potential; and
  a second node coupled to a second gate of the second transistor, a second current source, and a second resistive element, an opposite end of the second resistive element being coupled to a power supply.

* * * * *